US009793433B2

(12) United States Patent
Liao et al.

(10) Patent No.: US 9,793,433 B2
(45) Date of Patent: Oct. 17, 2017

(54) UV LIGHT EMITTING DEVICES AND SYSTEMS AND METHODS FOR PRODUCTION

(71) Applicant: Rayvio Corporation, Hayward, CA (US)

(72) Inventors: Yitao Liao, Hayward, CA (US); Robert Walker, Hayward, CA (US); Doug Collins, Hayward, CA (US)

(73) Assignee: RAYVIO CORPORATION, Hayward, CA (US)

( * ) Notice: Subject to any disclaimer, the term of this patent is extended or adjusted under 35 U.S.C. 154(b) by 0 days.

(21) Appl. No.: 15/288,181

(22) Filed: Oct. 7, 2016

(65) Prior Publication Data
US 2017/0025565 A1    Jan. 26, 2017

Related U.S. Application Data

(62) Division of application No. 14/806,370, filed on Jul. 22, 2015, now abandoned.
(Continued)

(51) Int. Cl.
*H01L 33/00* (2010.01)
*H01L 33/16* (2010.01)
(Continued)

(52) U.S. Cl.
CPC ...... *H01L 33/0075* (2013.01); *C23C 14/0036* (2013.01); *C23C 14/0617* (2013.01);
(Continued)

(58) Field of Classification Search
CPC ............... H01L 33/0075; H01L 33/007; H01L 33/0025; H01L 33/0062; H01L 33/06;
(Continued)

(56) References Cited

U.S. PATENT DOCUMENTS

| 7,585,769 B2 | 9/2009 | Bour et al. |
| 8,409,895 B2 | 4/2013 | Zhu et al. |

(Continued)

FOREIGN PATENT DOCUMENTS

KR    10-2014-0035094 A    3/2014

OTHER PUBLICATIONS

International Search Report and Written Opinion for PCT/US2015/041588, filed Jul. 22, 2015.

*Primary Examiner* — Thanhha Pham
(74) *Attorney, Agent, or Firm* — Richard T. Ogawa; Ogawa P.C.

(57) ABSTRACT

A method of fabricating an ultraviolet (UV) light emitting device includes receiving a UV transmissive substrate, forming a first UV transmissive layer comprising aluminum nitride upon the UV transmissive substrate using a first deposition technique at a temperature less than about 800 degrees Celsius or greater than about 1200 degrees Celsius, forming a second UV transmissive layer comprising aluminum nitride upon the first UV transmissive layer comprising aluminum nitride using a second deposition technique that is different from the first deposition technique, at a temperature within a range of about 800 degrees Celsius to about 1200 degrees Celsius, forming an n-type layer comprising aluminum gallium nitride layer upon the second UV transmissive layer, forming one or more quantum well structures comprising aluminum gallium nitride upon the n-type layer, and forming a p-type nitride layer upon the one or more quantum well structures.

8 Claims, 5 Drawing Sheets

Related U.S. Application Data

(60) Provisional application No. 62/028,256, filed on Jul. 23, 2014.

(51) Int. Cl.

| | | |
|---|---|---|
| *H01L 33/18* | (2010.01) | |
| *H01L 21/02* | (2006.01) | |
| *C23C 14/06* | (2006.01) | |
| *C23C 14/00* | (2006.01) | |
| *C23C 16/18* | (2006.01) | |
| *H01L 33/06* | (2010.01) | |
| *H01L 33/32* | (2010.01) | |
| *C23C 14/56* | (2006.01) | |
| *C23C 16/30* | (2006.01) | |
| *C23C 16/48* | (2006.01) | |
| *C23C 16/54* | (2006.01) | |

(52) U.S. Cl.
CPC ........ *C23C 14/0641* (2013.01); *C23C 14/568* (2013.01); *C23C 16/18* (2013.01); *C23C 16/303* (2013.01); *C23C 16/481* (2013.01); *C23C 16/54* (2013.01); *H01L 21/0243* (2013.01); *H01L 21/0254* (2013.01); *H01L 21/0262* (2013.01); *H01L 21/02458* (2013.01); *H01L 21/02505* (2013.01); *H01L 33/007* (2013.01); *H01L 33/0025* (2013.01); *H01L 33/0062* (2013.01); *H01L 33/06* (2013.01); *H01L 33/16* (2013.01); *H01L 33/18* (2013.01); *H01L 33/32* (2013.01); *H01L 2933/0091* (2013.01)

(58) Field of Classification Search
CPC ..... H01L 33/16; H01L 33/18; H01L 21/0262; C23C 14/0617
See application file for complete search history.

(56) References Cited

U.S. PATENT DOCUMENTS

| | | |
|---|---|---|
| 2007/0240631 A1 | 10/2007 | Nijhawan et al. |
| 2010/0032647 A1 | 2/2010 | Khan et al. |
| 2012/0295418 A1 | 11/2012 | Melnik et al. |
| 2013/0256630 A1 | 10/2013 | Han et al. |
| 2014/0014897 A1 | 1/2014 | Kim et al. |
| 2015/0295133 A1* | 10/2015 | Billingsley ......... H01L 33/0075 257/13 |

* cited by examiner

UV LIGHT EMITTING DEVICES AND SYSTEMS AND METHODS FOR PRODUCTION

CROSS-REFERENCE TO RELATED APPLICATIONS

The present application is a divisional of and claims priority to U.S. application Ser. No. 14/806,370 filed Jul. 22, 2015, which is a non-provisional of and claims priority to provisional App. No. 62/028,256 filed Jul. 23, 2014. The present application is also related to co-pending U.S. patent application Ser. No. 13/646,038 filed Oct. 5, 2012 and U.S. patent application Ser. No. 14/194,425 (now U.S. Pat. No. 9,112,103 issued on Aug. 18, 2015), filed Feb. 28, 2014. The above references are incorporated by reference herein, for all purposes.

BACKGROUND

The present invention relates to UV light emitting devices. Additionally, embodiments of the present invention relate to UV light emitting devices, fabrication techniques and equipment for fabricating UV light emitting devices.

As illustrated and disclosed in U.S. Pat. No. 8,409,895 issued Apr. 2, 2013, U.S. patent application Ser. No. 11/404,516, filed on Apr. 14, 2006, and Ser. No. 11/429,022, filed on May 5, 2006, various techniques and systems have been previously proposed to form a buffer layer for visible light LEDs. However, because UV light has significantly higher wavelengths, buffer layers suitable for visible light LED can be unsuitable for UV light emitting devices. More specifically, the inventors of the present invention recognize that UV light emitting devices based upon (AlxGa(1-x))N, require higher quality buffer layers that are not disclosed or provided by the above prior art.

What is desired are improved methods and apparatus for forming buffer layers for UV light emitting devices, with reduced drawbacks.

SUMMARY

In the fabrication of typical semiconductor devices, there is an emphasis for reducing the number of fabrication steps to reduce costs and reduce errors. The reduction is steps may include eliminating formation of a layer, eliminating a masking layer, and reducing alignment tolerances. The reduced number of fabrication steps almost always directly correlates to lower fabrication costs.

The inventor of the present invention have recognized that various embodiments of the present invention are costly in terms of additional fabrication steps and increased hardware requirements, however these embodiments provide surprising benefits.

One example of the present invention includes replacing a single buffer layer comprising aluminum nitride deposited in a growth chamber/single process with a minimum of two layers comprising aluminum nitride deposited in two different growth processes in one or two chambers. Aluminum nitride layers deposited in two different chambers exhibits different material properties as a result of different crystal grow techniques leading to faster cycle time, or simpler growth condition and process requirements, reduced impurity concentration, or superior performance.

In some examples, the first category of growth chamber for the first layer comprising aluminum nitride can include, but not limited to: hydride vapor phase epitaxy, atomic layer deposition, liquid phase epitaxy, physical vapor deposition, sputtering, solid source solution epitaxy. Further, in some examples, the first category of growth chamber for the first layer comprising aluminum nitride can have the following characteristics, but not limited to growth temperature of the layer comprising aluminum nitride is in the temperature that is lower than 800 degrees Celsius or higher than 1200 degrees Celsius.

In some examples, the second category of growth chamber for the second layer comprising aluminum nitride can include, but not limited to: metalorganic chemical vapor deposition, metalorganic vapor phase epitaxy, molecular beam epitaxy, or chemical beam epitaxy. Further, in some examples, the second category of growth chamber for the second layer comprising aluminum nitride can have the following characteristics, but not limited to growth temperature of the layer comprising aluminum nitride is in the temperature that is equal or higher than 800 degrees Celsius and equal or lower than 1200 degrees Celsius.

In some embodiments, instead of a single composition aluminum nitride buffer layer as a foundation for a UV light emitting source, embodiments detail a dual layer aluminum nitride material having a quick growth low quality aluminum nitride material followed by a high quality crystalline aluminum nitride material in separate growth chambers. The quality of the aluminum nitride materials specified in a dual layer growth method can be characterized and differentiated by, including, but not limited to, the following characteristics: polycrystalline or single crystalline, dislocation density, point defects, optical transparency, or the like. In various embodiments, the inventors recognize that the quick growth, low quality aluminum nitride material should still maintain a defect density lower than 1e10 cm-2 so UV light is not excessively scattered or absorbed within the buffer layer. Additionally, the quick growth, low quality aluminum nitride material should have a background contamination, of oxygen, carbon, etc. less than about 1e18 cm-3, and of hydrogen of less than about 1e20 cm-3 so that UV light is not excessively scattered or absorbed within the buffer layer. The latter factors may be facilitated through the use of higher purity source gasses, higher purity elemental sources, higher quality cleanings, higher quality vacuums, and the like.

The inventors believe that a single aluminum nitride buffer layer based upon HVPE or PVD or the like is insufficient to provide a high quality growth surface necessary for formation of a UV light emitting source. This is because of the higher frequencies of light provided by a UV light source compared to a conventional visible light LED. More succinctly, the inventors do not believe that a UV light source could be effectively paired with a polycrystalline aluminum nitride buffer layer. Additionally, the inventors believe that a single aluminum nitride buffer layer based upon MOCVD, MBE, or the like is too time consuming. More specifically, the growth of a sufficiently thick single crystal aluminum nitride layer is slow. Accordingly, benefits provided by embodiments of the present invention provide lower fabrication times, but still provide a high quality growth surface required by UV light sources.

With various embodiments of the present invention, the inventors believe that using the first category of growth chambers such as PVD or HVPE to grow the first layer comprising aluminum nitride can lead to reduced growth time required by the second category of growth chambers such as MOCVD or MBE, leading to reduction of the overall cycle time for a complete UV LED structure, as described in the present invention. Further, in order to reduce contamination by exposure to atmosphere environments, it is necessary to transfer the wafer after completion of growth of the first layer comprising aluminum nitride in the first growth chamber to the second growth chamber for the growth of the second layer comprising aluminum nitride under vacuum, preferably using a robotic arm to move the wafer from the first chamber to the second chamber. The same concept applies to a multiple chamber epitaxy growth system comprising more than two chambers as well.

Various embodiments of the present invention include a UV transparent substrate that is patterned with UV diffusive structures, e.g. gratings, or the like. A buffer layer is formed upon the UV transparent substrate that includes a minimum of two layers. The first layer adjacent to the substrate is primarily a poly crystalline material including aluminum and nitrogen, e.g. aluminum nitride. The second layer on top of the first layer is primarily a crystalline material including aluminum and nitrogen, e.g. aluminum nitride. The buffer layer serves as a foundation for a stack of aluminum, gallium and nitrogen-based material (e.g. a UV light emitting device).

In various embodiment, the stack of material includes an n-type material having aluminum, gallium, and nitrogen, e.g. $Al_xGa(1-x)N$ on top of the buffer layer; one or more quantum well material having aluminum, gallium and nitrogen, e.g. $Al_yGa(1-y)N$ on top of the n-doped material; and a p-type material having aluminum, gallium, and nitrogen, e.g. $Al_zGa(1-z)N$. In other embodiments, the stack includes a semiconductor structure such as a transistor, a high electronic mobility transistor comprising aluminum gallium nitride; the stack includes a semiconductor structure such as a laser comprising aluminum gallium nitride; the stack includes a semiconductor structure such as a MEMS devices with piezoelectric effects induced by material comprising aluminum gallium nitride; or the like.

Various embodiments of the present invention include methods for fabricating a UV light emitting device. Fabrication steps may include formation of a two-part buffer layer upon a UV transparent substrate. In various embodiments, the term buffer layer refers to not only a buffer layer that comprises low quality, very thin (a few nanometer, or a few tens of nanometer) polycrystalline layer for subsequent growth of high quality mostly single-crystalline layer, but also refers to a general purpose template layer than comprises a low quality layer and a high quality layer which can amount to a total thickness of a few microns.

In some embodiments, a material of the first part of the buffer layer includes aluminum and nitrogen, and is formed using one of the following processes: hydride vapor phase epitaxy, atomic layer deposition, liquid phase epitaxy, physical vapor deposition, sputtering, and solid source solution epitaxy, or combination thereof. A material of the second part of the buffer layer includes aluminum and nitrogen, and is formed using one of the following processes: metalorganic chemical vapor deposition, metalorganic vapor phase epitaxy, molecular beam epitaxy, and chemical beam epitaxy, or combination thereof. The processes for forming the first part of the buffer layer are different from forming the second part of the buffer layer. Subsequently, a process includes depositing a stack of material that forms a UV light source. In some embodiments, the process includes depositing an n-doped material having aluminum, gallium and nitrogen; depositing one or more a quantum well structures having aluminum, gallium and nitrogen, and depositing a p-doped material having aluminum, gallium and nitrogen. The processes for forming the UV light source may include one or more of the following processes: metalorganic chemical vapor deposition, metalorganic vapor phase epitaxy, molecular beam epitaxy, and chemical beam epitaxy. In some examples, the process in the first chamber may include a nitridation step where the substrate is subjected to a flux of active nitrogen, or a flow of ammonia.

Various embodiments of the present invention include a multi-chambered process for forming a UV light emitting device. A first chamber is adapted to form a first part of a buffer layer with aluminum and nitrogen in a low temperature process, e.g. <800 C or a high temperature process, e.g. >1200 C. A second chamber is for forming a second part of a buffer layer with aluminum and nitrogen in a medium temperature process, e.g. between about 800 C and about 1200 C. The second chamber or one or more additional chambers may also be used for forming a stack of materials that form UV light source above the buffer layer. This includes formation of an n-doped material having aluminum, gallium and nitrogen, formation of one or more quantum well material having aluminum, gallium and nitrogen, and formation of an p-doped material having aluminum, gallium and nitrogen. The second or one or more additional chambers may be suitable for one of the following processes: metalorganic chemical vapor deposition, metalorganic vapor phase epitaxy, molecular beam epitaxy, and chemical beam epitaxy. In various embodiments, a wafer handling tool is directed by one or more programs running upon a microprocessor to move a wafer to the first chamber, from the first chamber to the second chamber, and from the second chamber to additional chambers, or the like. In some embodiments, when transferring the wafer from the first chamber to the second, the wafer may be under a controlled atmosphere, a vacuum, or the like.

According to one aspect of the invention, a method of fabricating an ultraviolet (UV) light emitting device is disclosed. A technique may include receiving a UV transmissive substrate, and forming a UV transmissive layer upon the UV transmissive substrate, that includes forming a first UV transmissive layer comprising aluminum nitride upon the UV transmissive substrate using a first deposition technique at a temperature less than about 800 degrees Celsius or greater than about 1200 degrees Celsius; and forming a second UV transmissive layer comprising aluminum nitride upon the first UV transmissive layer comprising aluminum nitride using a second deposition technique that is different from the first deposition technique, at a temperature within a range of about 800 degrees Celsius to about 1200 degrees Celsius. A process may include forming a UV light emitting layer structure on the UV transmissive layer, including forming an n-type layer comprising aluminum gallium nitride layer upon the UV transmissive layer, forming one or more quantum well structures comprising aluminum gallium nitride upon the n-type layer, and forming a p-type nitride layer upon the one or more quantum well structures.

According to another aspect of the invention, an ultraviolet (UV) light emitting device is disclosed. One device includes a UV transmissive substrate, and a UV transmissive layer disposed upon the UV transmissive substrate. In some embodiments, the UV transmissive layer may include a first UV transmissive layer comprising aluminum nitride disposed upon the UV transmissive substrate at a temperature less than about 800 degrees Celsius or greater than about 1200 degrees Celsius, and a second UV transmissive layer comprising aluminum nitride disposed upon the first UV transmissive aluminum nitride material at a temperature within a range of about 800 degrees Celsius to about 1200 degrees Celsius. One device includes a UV light emitting structure disposed upon the UV transmissive layer. In some embodiments, the UV light emitting layer structure includes an n-type layer comprising aluminum gallium nitride disposed upon the UV transmissive layer, one or more quantum well structures disposed upon the n-type layer, and a p-type layer comprising nitride material disposed upon the one or more quantum well structures.

DETAILED DESCRIPTION

Figure 1:
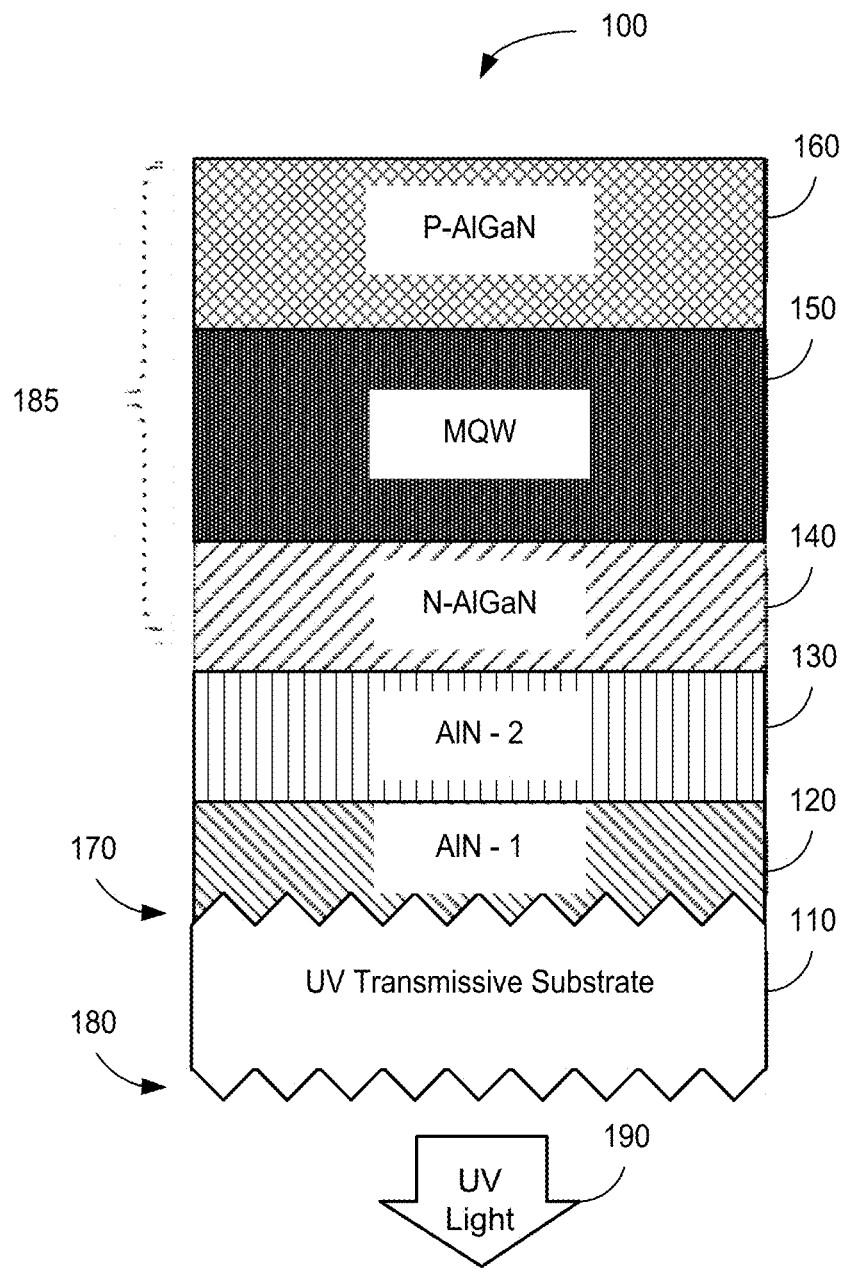
FIG. 1 illustrates a UV light emitting structure including a two layer aluminum nitride buffer layer on a UV transmissive substrate.

The fabrication of aluminum gallium nitride-based UV light emitting devices with an aluminum nitride buffer layers is described. In the following description, numerous specific details are set forth, such as process chamber configurations and material regimes, in order to provide a thorough understanding of embodiments of the present invention. It will be apparent to one skilled in the art that embodiments of the present invention may be practiced without these specific details. In other instances, well-known features, such as specific diode configurations, are not described in detail in order to not unnecessarily obscure embodiments of the present invention. Furthermore, it is to be understood that the various embodiments shown in the Figures are illustrative representations and are not necessarily drawn to scale. Additionally, other arrangements and configurations may not be explicitly disclosed in embodiments herein, but are still considered to be within the spirit and scope of the invention.

A UV light emitting device method of fabrication can include the formation of a buffer layer of aluminum nitride between a substrate and a device layer of un-doped and/or doped aluminum gallium nitride. In embodiments described herein, a multi-layer aluminum nitride buffer layer is used in between the substrate and the device layer of un-doped and doped aluminum gallium nitride. For the purposes herein "aluminum gallium nitride" or "AlGaN" refers generally to materials having aluminum, gallium and nitrogen, having the stoichiometric ratio of $(Al_xGa_{(1-x)})N$, where $0<x<1$. The multi-layer aluminum nitride layer may have a first layer formed by sputter deposition in a PVD process, and a second layer formed by a metalorganic vapor deposition (MOCVD) chamber or a molecular beam epitaxy (MBE) chamber. In other embodiments, the first layer may be formed by non-reactive sputtering from an aluminum nitride target housed in the PVD chamber or, alternatively, may be formed by reactive sputtering from an aluminum target housed in the PVD chamber and reacted with a nitrogen-based gas or plasma, or the like.

One or more of the embodiments described herein may enable higher throughput in a multi-chamber fabrication tool used for UV light emitting device fabrication. Additionally, the overall thermal budget of UV light emitting device fabrication may be reduced since the first layer of aluminum nitride layer may be formed at temperatures below about 800 degrees Celsius. By contrast, a typical aluminum gallium nitride buffer layer is formed between 800-1200 degrees Celsius. One or more of the embodiments described herein may enable faster deposition rates, e.g. two times the growth rate, for materials such as un-doped and/or n-type doped aluminum gallium nitride. Faster rates may be achieved since, in some embodiments, the un-doped and/or n-type doped aluminum gallium nitride layers are formed on a second layer of the aluminum nitride (AlN) buffer layer which is crystalline and may provide a correct crystal orientation and morphological relationship for growing un-doped and/or n-type doped aluminum gallium nitride layers thereon. The inventors have discovered that for UV light emitting devices, it is especially important to have the layer of material upon which the un-doped and/or n-type doped aluminum gallium nitride layers be crystalline. Further, forming such aluminum gallium nitride layers upon a polycrystalline aluminum nitride buffer layer fails to provide acceptable results. One or more of the embodiments described herein may enable elimination of oxide removal operations since many of the described operations are performed in-situ (within a vacuum) in a cluster tool. One or more of the embodiments described herein may enable an improvement of aluminum gallium nitride crystalline quality by forming the aluminum gallium nitride on a second layer of an aluminum nitride buffer layer.

Described in association with one or more embodiments herein are systems for the fabrication of aluminum gallium nitride-based UV light emitting devices with a first PVD-formed aluminum nitride buffer layer and a second MOCVD formed aluminum nitride buffer layer. In one embodiment, a multi-chamber system includes a PVD chamber, or the like having a target composed of a metallic or compound of aluminum to deposit a poly-crystalline aluminum nitride first layer. The multi-chamber system also includes chambers adapted to deposit a crystalline aluminum nitride on top of the first layer, chambers adapted to deposit un-doped or n-type aluminum gallium nitride, or both, and for other device layers such as multiple quantum well layers and p-type doped aluminum gallium nitride layers.

Also described in association with one or more embodiments herein are methods of fabricating aluminum gallium nitride-based UV light emitting devices with a multi-layer aluminum nitride buffer layers, including a quick-growth, low-temperature (e.g. PVD), or high temperature (e.g. HVPE) aluminum nitride buffer layer and a slow-growth, medium-temperature aluminum nitride buffer layer (e.g. MOCVD). In one embodiment, a method of fabricating a UV light emitting device includes forming a first aluminum nitride layer above a substrate in a PVD chamber of a multi-chamber system, and forming a second aluminum nitride layer above the first aluminum nitride layer in a MOCVD chamber of a multi chamber system. The method may also include forming an un-doped or n-type aluminum gallium nitride layer on the aluminum nitride layer in a second chamber of the multi-chamber system.

FIG. 1 illustrates a UV light emitting device 100 according to various embodiments of the present invention. In FIG.

1, a substrate 110 is illustrated. Substrate 110 is typically transmissive to UV light within different UV light regions, including the UV-C light region. In various embodiments, substrate 110 is considered transmissive if substrate 110 is transmissive of at least 50% of incident UV light; in other embodiments, the percentage may be higher, e.g. 70%, 90%, or the like.

As shown in the example in FIG. 1, substrate 110 may include interior geometric features 170 and/or exterior geometric features 180. In various embodiments, the geometric features 170 and/or 180 are used to facilitate light extraction from a UV light emitting device 185 and output of UV light 190. In various embodiments, geometric features 170 and/or 180 are of sufficient geometric scale so as to effectively scatter light within the UV frequency band. In particular, geometric features 170 and/or 180 may have a height on the order of a few hundred nanometers with a lateral spacing on the order of 0.1 to 5 microns. In some embodiments, only geometric features 170 or 180 or both are present upon substrate 110. Further shapes of geometric features 170 and 180 may be different from that illustrated, depending upon routine engineering considerations. Further details may be found in the patent application incorporated by reference, above.

In various embodiments, a first aluminum nitride layer 120 (buffer layer) is deposited upon substrate 110. The first AlN layer is quickly grown and includes a relatively high amount of defects. This quick growth may cause the first AlN layer to include high amounts of polycrystalline growth. As discussed above, the defects should remain below about 1e10 cm-2, with background contamination, i.e., oxygen, carbon less than about 1e18 cm-3 and hydrogen less than about 1e20 cm-3. A second aluminum nitride layer 130 (buffer layer) is then deposed upon the first AlN layer 120. The second AlN 130 layer grown at a slower rate and includes a relatively low amount of defects. This causes second AlN layer 130 to include high amounts of crystalline growth. The total thickness of the first and second layers comprising aluminum nitride may be in the range of a few nanometers to a few microns.

On top of buffer layers 120 and 130 is a UV light emitting structure 185. In various embodiments, UV light emitting source 185 includes a n-doped aluminum, gallium and nitrogen compound 140; one or more quantum wells 150, also formed from aluminum, gallium and nitrogen compound; and a p-doped aluminum, gallium and nitrogen compound 160. In various embodiments, the relative amount of aluminum, gallium, and nitrogen in layers 140, 150 and 160 may be the same or different with respect to each other. As an example, compound 140 may be $Al_xGa_{(1-x)}N$, compound 150 may be $Al_yGa_{(1-y)}N$, and compound 160 may be $Al_zGa_{(1-x)}N$, or the like. The values of x, y, and z depend upon the desired wavelengths of UV light provided by UV light emitting source 185. Optionally the p-AlGaN layer may be p-GaN without aluminum content. Further details with regards to UV light emitting source 185 are found in the patent application incorporated by reference, above.

Figure 2A:
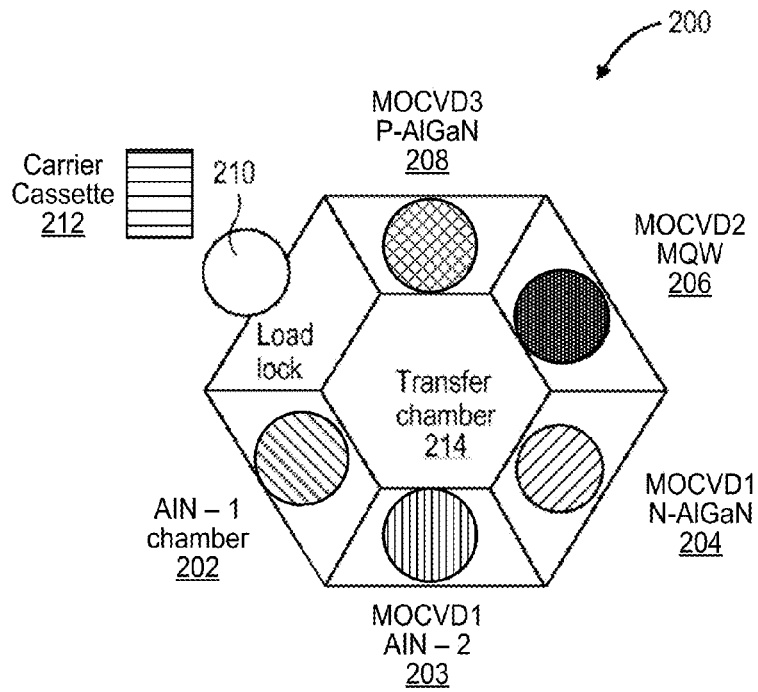
FIG. 2A illustrates an example of a multiple chamber tool for growth of a multi-layer aluminum nitride buffer having and aluminum, gallium and nitrogen based UV light emitting source with a transfer chamber system.
Figure 2B:
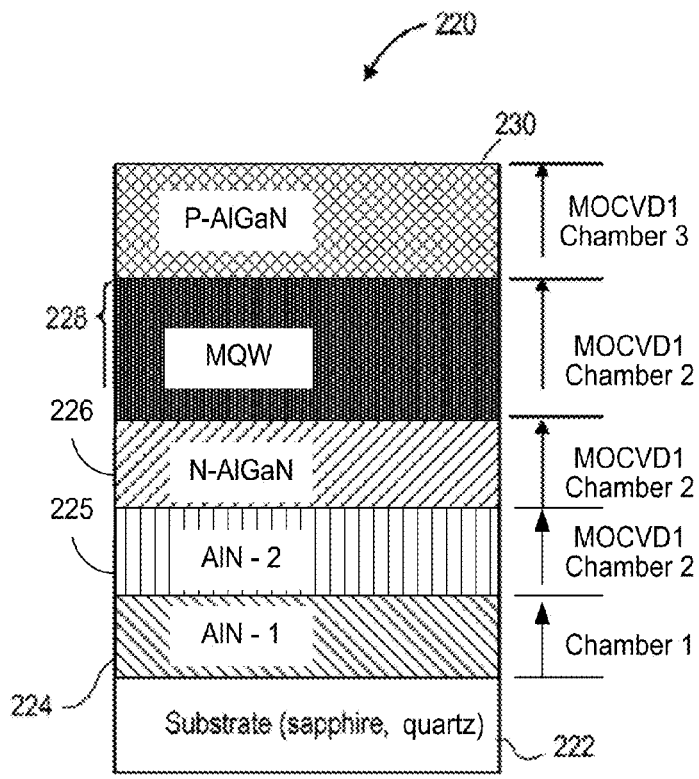
FIG. 2B illustrates a UV light-emitting device structure in accordance with an embodiment of the present invention.

FIG. 2A illustrates a cluster tool schematic for UV light emitting device structure fabrication, in accordance with an embodiment of the present invention. FIG. 2B illustrates an UV light emitting device structure along with a corresponding time-to-deposition plot, in accordance with an embodiment of the present invention.

Referring to FIG. 2A, a multiple chamber tool 200 includes an aluminum nitride deposition chamber 202 (e.g. PVD AlN), an aluminum nitride MOCVD reaction chamber 203, an un-doped and/or n-type aluminum gallium nitride MOCVD reaction chamber 204 (MOCVD1: u-AlGaN/n-AlGaN), a multiple quantum well (MQW) MOCVD reaction chamber 206 (MOCVD2: MQW), and a p-type aluminum gallium nitride MOCVD reaction chamber 208 (MOCVD3: p-AlGaN). The cluster tool 200 may also include a load lock 210, a carrier cassette 212, and a transfer chamber 214, all of which are depicted in FIG. 2A.

In various embodiments described herein, chamber 202 may include a chamber adapted to perform: hydride vapor phase epitaxy, atomic layer deposition, liquid phase epitaxy, physical vapor deposition, sputtering, solid source solution epitaxy, or the like. Although embodiments herein refer to chamber 202 as a PVD chamber, it should be understood that chamber 202 may be adapted for any or all of these formation processes. Further, in various embodiments, chambers 203, 204, 206 and 208 may include one or more chambers adapted to perform: metalorganic chemical vapor deposition, metalorganic vapor phase epitaxy, molecular beam epitaxy, chemical beam epitaxy, or the like. Although embodiments herein refer to these chambers as MOCVD chambers, it should be understood that chambers 203, 204, 206, and 208 may be adapted for any or all of these formation processes.

In other embodiments, reaction chambers 202, 203, 204, 206 and 208 may be distinct individual chambers. In other embodiments, reaction chamber 203 may also be used as reaction chambers 204, 206 and/or 208; reaction chamber 204 may also be used as reaction chambers 206 and/or 208; reaction chamber 206 may also be used as reaction chamber 208; and the like. Separation of chambers 202, 203, 204, 206, and 208 may be desirable in some embodiments to reduce any potential cross-contamination between reactants within the respective chambers. However, as mentioned above, multiple deposition processes described herein may be performed within the same physical reaction chamber or within a smaller number of unique reaction chambers to reduce hardware costs. In some embodiments, reaction chamber 202 performs the initial aluminum nitride buffer layer; a single chamber takes the place of chambers 203, 204 and 206 for forming the second aluminum nitride buffer layer, forming the n-doped aluminum gallium nitride material, as well as the multiple quantum well structures; and a reaction chamber 208 forms the p-doped material. These three chambers may be disposed about a transfer chamber similar to that disclosed in FIG. 2A. In some embodiments, the reaction chambers may be organized in other arrangements, such as along a linear transfer mechanism, or the like.

Thus, in accordance with an embodiment of the present invention, a multi-chamber system includes a PVD chamber having a target of metallic or compound aluminum, and a chamber adapted to deposit a crystalline aluminum nitride, or both. In one embodiment, the target of the PVD chamber is composed of aluminum nitride. In such an embodiment, reactive sputtering need not be used since the target is composed of the same material desired for deposition. However, in an alternative embodiment, a target composed of aluminum is used, and aluminum nitride is reactively sputtered from the aluminum target by or in the presence of a nitrogen source. In one embodiment, the chamber adapted to deposit a crystalline aluminum nitride e is a MOCVD chamber, as depicted in FIG. 2A. However, in an alternative embodiment, the chamber adapted to deposit a crystalline aluminum nitride is a hydride vapor phase epitaxy (HVPE) chamber. In one embodiment, the PVD chamber and the chamber adapted to deposit a crystalline aluminum nitride are included in a cluster tool arrangement, as depicted in FIG. 2A. However, in an alternative embodiment, the PVD chamber and the chamber adapted to deposit a crystalline aluminum nitride are included in an in-line tool arrangement. Deposition processes based on PVD, as described herein, may be performed at temperatures approximating standard room temperature, or may be performed at higher temperatures.

Referring to FIG. 2B, a UV light emitting device structure 220 includes a stack of various material layers, many of which include III-V materials. For example, the UV light emitting device structure $^{220}$ includes a UV transmissive substrate 222 (Substrate: sapphire, quartz, free standing aluminum nitride, etc.) and a first aluminum nitride layer 224 (AlN) with a thickness approximately in the range of 10-200 nanometers. The aluminum nitride layer 224 is formed by sputter deposition in the PVD aluminum nitride sputter chamber 202 of cluster tool 200. An estimate process time for wafer handling, and depositing layer 224 is on the order of about 2 hours. The UV light emitting structure 220 also includes an approximately 1 microns thick of aluminum nitride 225, and approximately 2 microns thick of un-doped/ n-type aluminum gallium nitride combination or n-type aluminum gallium nitride-only layer 226 (n-AlGaN). The un-doped/n-type aluminum gallium nitride combination or n-type aluminum gallium nitride-only layer 226 may be formed in un-doped and/or n-type aluminum gallium nitride MOCVD reaction chamber 204 or 203 of cluster tool 200. The LED structure 220 also includes an MQW structure 228 with a thickness in the range of 30-300 nanometers. The MQW structure 228 is formed in MQW MOCVD reaction chamber 206 or 203 or 204 of cluster tool 200. In one embodiment, the MQW structure 228 is composed of one or a plurality of field pairs of AlGaN well/AlGaN barrier material layers. In various embodiments, it is estimated that formation of layers 225, 226 and 228 may take on the order of about 4 hours. The LED structure 220 also includes an approximately 20 to 200 nanometers thick p-type aluminum gallium aluminum nitride layer 230 (e.g. p-AlGaN, or p-GaN, or p-AlN) with a thickness in the range of 50-200 nanometers. The p-type nitride layer 230 is typically formed in p-type nitride MOCVD reaction chamber 208 of cluster tool 200. This process is expected to take on the order of an hour. It is to be understood that the above thicknesses or thickness ranges are exemplary embodiments, and that other suitable thicknesses or thickness ranges are also considered within the spirit and scope of embodiments of the present invention.

In addition to the throughput improvement for cluster tool 200, there may be additional benefits to a PVD chamber plus one to four MOCVD chambers tool arrangement. For example, cost savings may be achieved since less reaction gas may need to be delivered to the first MOCVD chamber. In the case that the above process enables a reduced thickness for the n-doped aluminum, gallium and nitrogen portion of device layer 220, simpler down-the-line etch-back processes may be performed. This may also enable the saving of material and operation cost while reducing cycle time. Also, by using a multiple aluminum nitride buffer layer in place of a single aluminum nitride buffer layer, faster growth of the buffer layer is enabled while maintaining a high quality buffer layer, thereby reduced defectivity in the active layers of a device, such as a UV light emitting device, may be achieved.

Thus, in accordance with an embodiment of the present invention, a multi-chamber system includes a PVD chamber, or the like having an aluminum nitride target to deposit a high growth-rate aluminum nitride layer, a first MOCVD chamber to deposit a high quality aluminum nitride layer, and a second MOCVD chamber to deposit un-doped or n-type aluminum gallium nitride. The multi-chamber system also includes third MOCVD chamber to deposit a multiple quantum well (MQW) structure, and a fourth MOCVD chamber to deposit p-type aluminum gallium nitride or p-type aluminum gallium nitride, or both. In one embodiment, the PVD chamber having the aluminum nitride target is for non-reactive sputtering of aluminum nitride. In a specific such embodiment, the PVD chamber is for non-reactive sputtering of aluminum nitride at a low or slightly elevated temperature approximately in the range of 20-200 degrees Celsius. In another specific such embodiment, the PVD chamber is for non-reactive sputtering of aluminum nitride at a high temperature approximately in the range of less than about 800 degrees or greater than 1200 degrees Celsius in the case of a HVPE chamber.

Figure 3:
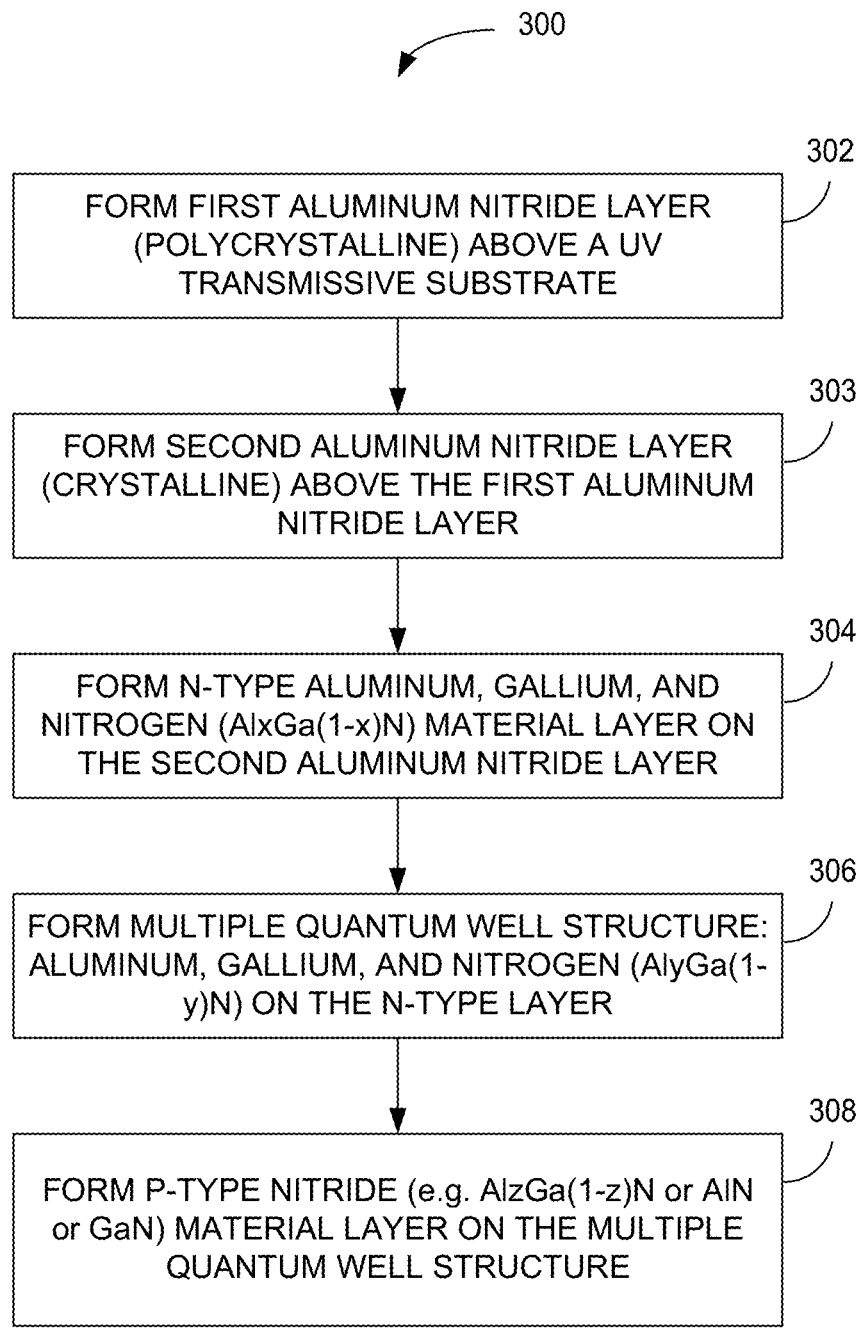
FIG. 3 is a flowchart representing operations in a method of fabricating an aluminum gallium nitride-based UV light emitting device with a two part aluminum nitride buffer layer, in accordance with an embodiment of the present invention.

In another aspect of the present invention, methods of fabricating aluminum gallium nitride-based UV light emitting device with multiple aluminum nitride buffer layers are provided. For example, FIG. 3 is a Flowchart 300 representing operations in a method of fabricating an aluminum gallium nitride-based light UV light source with a multiple process-formed aluminum nitride buffer layer, in accordance with an embodiment of the present invention.

Referring to operation 302 of Flowchart 300, a method includes forming a first aluminum nitride layer above a substrate in a PVD chamber, or the like. For example, an aluminum nitride layer may be formed in a chamber such as chamber 202 of cluster tool 200. In one embodiment, forming the aluminum nitride layer includes sputtering from an aluminum nitride target housed in the PVD chamber. In one embodiment, forming the aluminum nitride layer includes performing the forming at a low to slightly elevated substrate temperature approximately in the range of 20-200 degrees Celsius. In one embodiment, forming the aluminum nitride layer includes performing the forming at a high substrate temperature approximately in the range of 200-800 degrees Celsius. In some embodiments, the temperature may be below 800 degrees Celsius or above 1200 degrees Celsius. In various embodiments, this step enables a relatively quick growth of an aluminum nitride layer, however the material may be relatively polycrystalline in nature.

Referring to operation 303 of Flowchart 300, the method includes forming a second aluminum nitride layer above the first aluminum nitride layer. For example, an aluminum nitride layer may be formed in a chamber such as chamber 203 of cluster tool 200. In one embodiment, forming the aluminum nitride buffer layer includes performing the forming in a MOCVD chamber. In one embodiment, forming the aluminum nitride layer includes performing the forming in a HVPE chamber. In some embodiments, the chamber temperature may be between about 300 to 800 degrees Celsius to about 1200 degrees Celsius. In various embodiments, this step enables a high quality (relatively large single crystal) crystalline growth of an aluminum nitride layer, however the material may be relatively slow to form. Referring to operation 304 of Flowchart 300, the method includes forming an un-doped or n-type aluminum gallium nitride layer on the high quality aluminum nitride buffer layer. For example, an un-doped or n-type aluminum gallium nitride layer may be formed in a chamber such as chamber 204 of cluster tool 200. In one embodiment, forming the un-doped or n-type aluminum gallium nitride layer includes performing the forming in a MOCVD chamber. In one embodiment, forming the un-doped or n-type aluminum gallium nitride layer includes performing the forming in a HVPE chamber.

Referring to operation 306 of Flowchart 300, the method also includes forming a MQW structure above the un-doped or n-type aluminum gallium nitride layer. For example, a MQW structure may be formed in a chamber such as chamber 206 of cluster tool 200. In one embodiment, the MQW structure is composed of one or a plurality of field pairs of AlGaN well/AlGaN barrier material layers.

Referring to operation 308 of Flowchart 300, the method further includes forming a p-type aluminum gallium nitride or p-type gallium nitride layer above the MQW structure. In some embodiments, an undoped or p-type doped aluminum nitride layer may be used prior to the growth of the p-type aluminum gallium nitride or p-type gallium nitride layers. For example, the p-type aluminum gallium nitride or p-type aluminum gallium nitride layer may be formed in a chamber such as chamber 208 of cluster tool 200.

As discussed above, the amount of aluminum versus gallium used within the chambers may be different in steps 304 to 308. The proportions are selected, based upon desired range of output UV light desired.

Exemplary embodiments of tool platforms suitable for housing a PVD chamber along with three MOCVD chambers include an Opus™ AdvantEdge™ system or a Centura™ system, both commercially available from Applied Materials, Inc. of Santa Clara, Calif. Embodiments of the present invention further include an integrated metrology (IM) chamber as a component of the multi-chambered processing platform. The IM chamber may provide control signals to allow adaptive control of integrated deposition process, such as the multiple segmented sputter or epitaxial growth processes described above in association with FIG. 3. The IM chamber may include a metrology apparatus suitable to measure various film properties, such as thickness, roughness, composition, and may further be capable of characterizing grating parameters such as critical dimensions (CD), sidewall angle (SWA), feature height (HT) under vacuum in an automated manner. Examples include, but are not limited to, optical techniques like reflectometry and scatterometry. In particularly advantageous embodiments, in-vacuo optical CD (OCD) techniques are employed where the attributes of a grating formed in a starting material are monitored as the sputter and/or epitaxial growth proceeds. In other embodiments, metrology operations are performed in a process chamber, e.g., in-situ in the process chamber, rather than in a separate IM chamber.

A multi-chambered processing platform, such as cluster tool 200 may further include an optional substrate aligner chamber, as well as load lock chambers holding cassettes, coupled to a transfer chamber including a robotic handler. In one embodiment of the present invention, adaptive control of the multi-chambered processing platform 200 is provided by a controller. The controller may be one of any form of general-purpose data processing system that can be used in an industrial setting for controlling the various subprocessors and subcontrollers. Generally, the controller includes a central processing unit (CPU) in communication with a memory and an input/output (I/O) circuitry, among other common components. As an example, the controller may perform or otherwise initiate one or more of the operations of any of the methods/processes described herein, including the method described in association with Flowchart 300. Any computer program code that performs and/or initiates such operations may be embodied as a computer program product. Each computer program product described herein may be carried by a medium readable by a computer (e.g., a floppy disc, a compact disc, a DVD, a hard drive, a random access memory, etc.).

Suitable PVD chambers for the processes and tool configurations contemplated herein may include the Endura PVD system, commercially available from Applied Materials, Inc. of Santa Clara, Calif. The Endura PVD system provides superior electromigration resistance and surface morphology as well as low cost of ownership and high system reliability. PVD processes performed therein may be done so at requisite pressures and suitable target-to-wafer distance which creates directional flux of deposited species in the process cavity. Chambers compatible with in-line systems such as the ARISTO chamber, also commercially available from Applied Materials, Inc. of Santa Clara, Calif., provides automated loading and unloading capabilities, as well as a magnetic carrier transport system, permitting significantly reduced cycle times. The AKT-PiVot 55 KV PVD system, also commercially available from Applied Materials, Inc. of Santa Clara, Calif., has a vertical platform for sputtering deposition. The AKT-PiVot system's module architecture delivers significantly faster cycle time and enables a large variety of configurations to maximize production efficiency. Unlike traditional in-line systems, the AKT-PiVot's parallel processing capability eliminates bottlenecks caused by different process times for each film layer. The system's cluster-like arrangement also allows continuous operation during individual module maintenance. The included rotary cathode technology enables nearly 3× higher target utilization as compared with conventional systems. The PiVot system's deposition modules feature a pre-sputter unit that enables target conditioning using only one substrate, rather than up to 50 substrates that are needed with other systems to achieve the same results.

Figure 4:
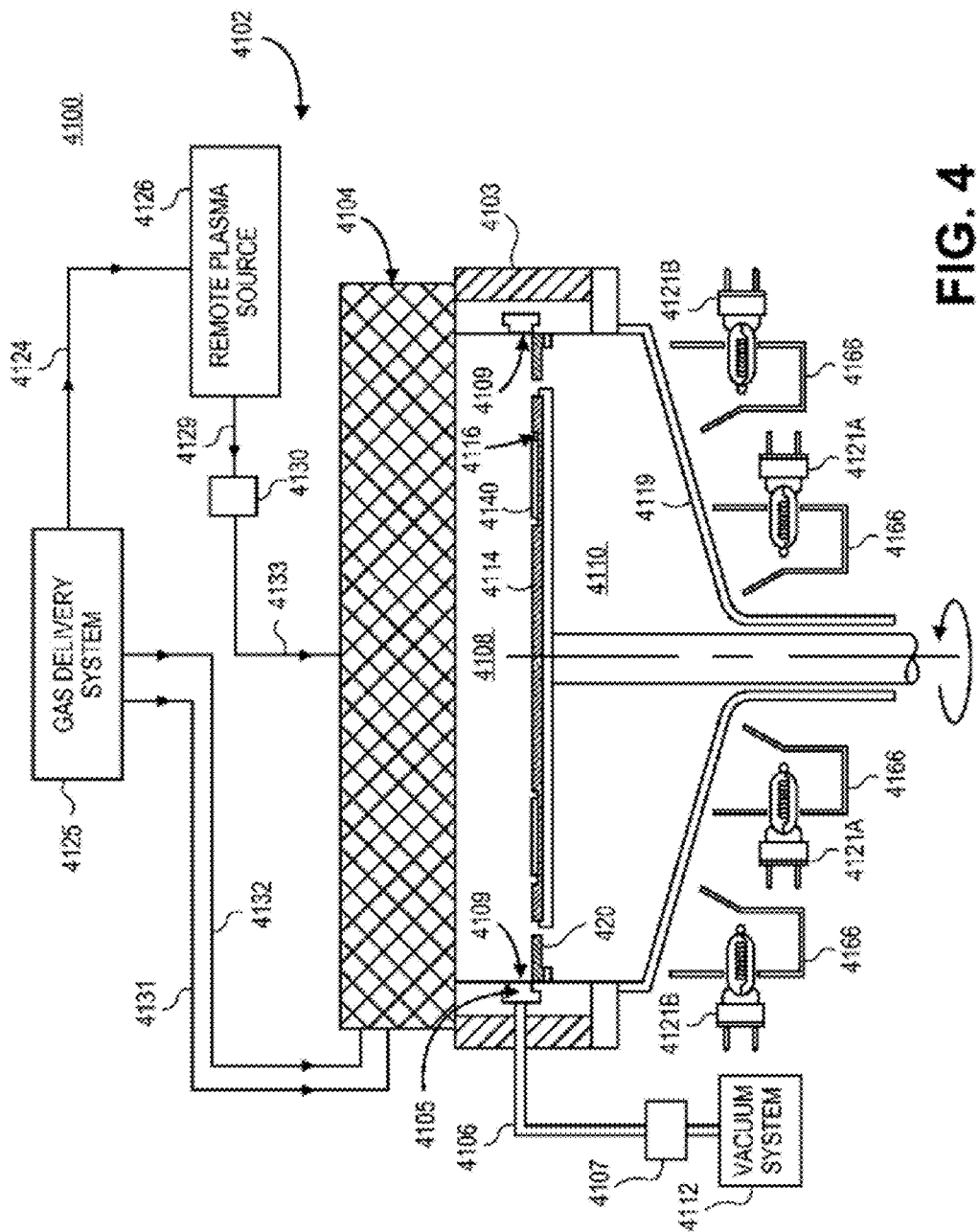
FIG. 4 is a schematic cross-sectional view of a chamber suitable for the fabrication of fabrication of materials, in accordance with an embodiment of the present invention.

An example of an MOCVD deposition chamber which may be suitable for use as one or more of MOCVD chambers 203, 204, 206, or 208, described above, is illustrated and described with respect to FIG. 4. FIG. 4 is a schematic cross-sectional view of an MOCVD chamber according to an embodiment of the invention. Exemplary systems and chambers that may be adapted to practice the present invention are described in U.S. patent application Ser. No. 11/404,516, filed on Apr. 14, 2006, and Ser. No. 11/429,022, filed on May 5, 2006, both of which are incorporated by reference in their entireties.

The apparatus 4100 shown in FIG. 4 includes a chamber 4102, a gas delivery system 4125, a remote plasma source 4126, and a vacuum system 4112. The chamber 4102 includes a chamber body 4103 that encloses a processing volume 4108. A showerhead assembly 4104 is disposed at one end of the processing volume 4108, and a substrate carrier 4114 is disposed at the other end of the processing volume 4108. A lower dome 4119 is disposed at one end of a lower volume 4110, and the substrate carrier 4114 is disposed at the other end of the lower volume 4110. The substrate carrier 4114 is shown in process position, but may be moved to a lower position where, for example, the substrates 4140 may be loaded or unloaded. An exhaust ring 4120 may be disposed around the periphery of the substrate carrier 4114 to help prevent deposition from occurring in the lower volume 4110 and also help direct exhaust gases from the chamber 4102 to exhaust ports 4109. The lower dome 4119 may be made of transparent material, such as high-purity quartz, to allow light to pass through for radiant heating of the substrates 4140. The radiant heating may be provided by a plurality of inner lamps 4121A and outer lamps 4121B disposed below the lower dome 4119, and reflectors 4166 may be used to help control chamber 4102 exposure to the radiant energy provided by inner and outer lamps 4121A, 4121B. Additional rings of lamps may also be used for finer temperature control of the substrate 4140.

The substrate carrier 4114 may include one or more recesses 4116 within which one or more substrates 4140 may be disposed during processing. The substrate carrier 4114 may carry six or more substrates 4140. In one embodiment, the substrate carrier 4114 carries eight substrates 4140. It is to be understood that more or less substrates 4140 may be carried on the substrate carrier 4114. Typical substrates 4140 may include sapphire or quartz. It is to be understood that other types of UV transmissive substrates 4140, such as glass substrates 4140, may be processed. Substrate 4140 size may range from 50 mm-100 mm in diameter or larger. The substrate carrier 4114 size may range from 200 mm-750 mm. The substrate carrier 4114 may be formed from a variety of materials, including SiC or SiC-coated graphite. It is to be understood that substrates 4140 of other sizes may be processed within the chamber 4102 and according to the processes described herein. The showerhead assembly 4104 may allow for more uniform deposition across a greater number of substrates 4140 and/or larger substrates 4140 than in traditional MOCVD chambers, thereby increasing throughput and reducing processing cost per substrate 4140.

The substrate carrier 4114 may rotate about an axis during processing. In one embodiment, the substrate carrier 4114 may be rotated at about 2 RPM to about 100 RPM. In another embodiment, the substrate carrier 4114 may be rotated at about 30 RPM. Rotating the substrate carrier 4114 aids in providing uniform heating of the substrates 4140 and uniform exposure of the processing gases to each substrate 4140.

The plurality of inner and outer lamps 4121A, 4121B may be arranged in concentric circles or zones (not shown), and each lamp zone may be separately powered. In one embodiment, one or more temperature sensors, such as pyrometers (not shown), may be disposed within the showerhead assembly 4104 to measure substrate 4140 and substrate carrier 4114 temperatures, and the temperature data may be sent to a controller (not shown) which can adjust power to separate lamp zones to maintain a predetermined temperature profile across the substrate carrier 4114. In another embodiment, the power to separate lamp zones may be adjusted to compensate for precursor flow or precursor concentration non-uniformity. For example, if the precursor concentration is lower in a substrate carrier 4114 region near an outer lamp zone, the power to the outer lamp zone may be adjusted to help compensate for the precursor depletion in this region.

The inner and outer lamps 4121A, 4121B may heat the substrates 4140 to a temperature of about 400 degrees Celsius to about 1200 degrees Celsius. It is to be understood that the invention is not restricted to the use of arrays of inner and outer lamps 4121A, 4121B. Any suitable heating source may be utilized to ensure that the proper temperature is adequately applied to the chamber 4102 and substrates 4140 therein. For example, in another embodiment, the heating source may include resistive heating elements (not shown) which are in thermal contact with the substrate carrier 4114.

A gas delivery system 4125 may include multiple gas sources, or, depending on the process being run, some of the sources may be liquid sources rather than gases, in which case the gas delivery system may include a liquid injection system or other means (e.g., a bubbler) to vaporize the liquid. The vapor may then be mixed with a carrier gas prior to delivery to the chamber 4102. Different gases, such as precursor gases, carrier gases, purge gases, cleaning/etching gases or others may be supplied from the gas delivery system 4125 to separate supply lines 4131, 4132, and 4133 to the showerhead assembly 4104. The supply lines 4131, 4132, and 4133 may include shut-off valves and mass flow controllers or other types of controllers to monitor and regulate or shut off the flow of gas in each line.

A conduit 4129 may receive cleaning/etching gases from a remote plasma source 4126. The remote plasma source 4126 may receive gases from the gas delivery system 4125 via supply line 4124, and a valve 4130 may be disposed between the showerhead assembly 4104 and remote plasma source 4126. The valve 4130 may be opened to allow a cleaning and/or etching gas or plasma to flow into the showerhead assembly 4104 via supply line 4133 which may be adapted to function as a conduit for a plasma. In another embodiment, apparatus 4100 may not include remote plasma source 4126 and cleaning/etching gases may be delivered from gas delivery system 4125 for non-plasma cleaning and/or etching using alternate supply line configurations to shower head assembly 4104.

The remote plasma source 4126 may be a radio frequency or microwave plasma source adapted for chamber 4102 cleaning and/or substrate 4140 etching. Cleaning and/or etching gas may be supplied to the remote plasma source 4126 via supply line 4124 to produce plasma species which may be sent via conduit 4129 and supply line 4133 for dispersion through showerhead assembly 4104 into chamber 4102. Gases for a cleaning application may include fluorine, chlorine or other reactive elements.

In another embodiment, the gas delivery system 4125 and remote plasma source 4126 may be suitably adapted so that precursor gases may be supplied to the remote plasma source 4126 to produce plasma species which may be sent through showerhead assembly 4104 to deposit CVD layers, such as III-V films, for example, on substrates 4140.

A purge gas (e.g., nitrogen) may be delivered into the chamber 4102 from the showerhead assembly 4104 and/or from inlet ports or tubes (not shown) disposed below the substrate carrier 4114 and near the bottom of the chamber body 4103. The purge gas enters the lower volume 4110 of the chamber 4102 and flows upwards past the substrate carrier 4114 and exhaust ring 4120 and into multiple exhaust ports 4109 which are disposed around an annular exhaust channel 4105. An exhaust conduit 4106 connects the annular exhaust channel 4105 to a vacuum system 4112 which includes a vacuum pump (not shown). The chamber 4102 pressure may be controlled using a valve system 4107 which controls the rate at which the exhaust gases are drawn from the annular exhaust channel 4105.

Figure 5:
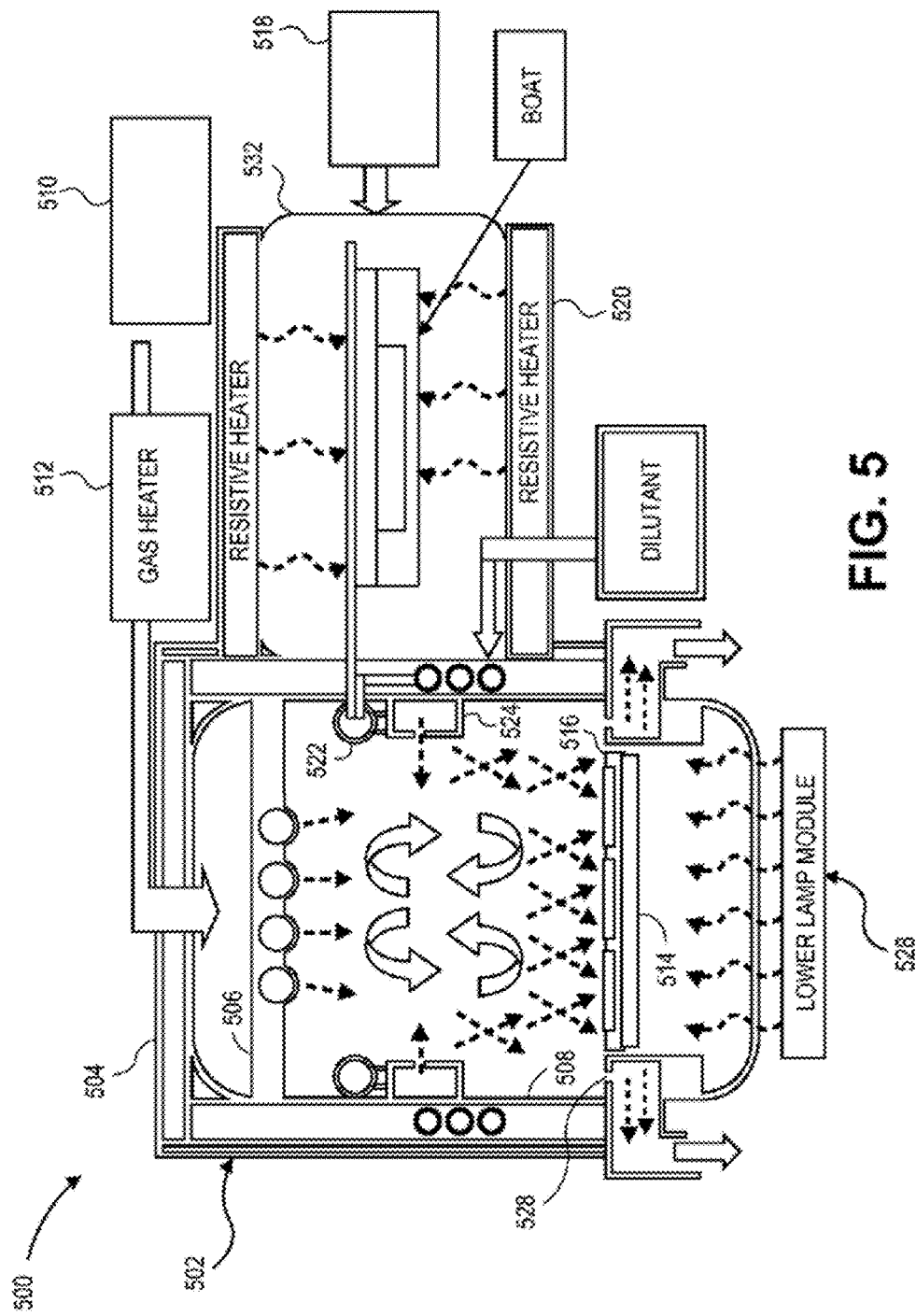
FIG. 5 is a schematic cross-sectional view of a chamber suitable for the fabrication of materials, in accordance with an embodiment of the present invention.

An example of a HVPE deposition chamber which may be suitable for use as the HVPE chamber 204 of alternative embodiments of chamber 204, described above, is illustrated and described with respect to FIG. 5. FIG. 5 is a schematic cross-sectional view of a HVPE chamber 500 suitable for the fabrication of group III-nitride materials, in accordance with an embodiment of the present invention.

The apparatus 500 includes a chamber 502 enclosed by a lid 504. Processing gas from a first gas source 510 is delivered to the chamber 502 through a gas distribution showerhead 506. In one embodiment, the gas source 510 includes a nitrogen containing compound. In another embodiment, the gas source 510 includes ammonia. In one embodiment, an inert gas such as helium or diatomic nitrogen is introduced as well either through the gas distribution showerhead 506 or through the walls 508 of the chamber 502. An energy source 512 may be disposed between the gas source 510 and the gas distribution showerhead 506. In one embodiment, the energy source 512 includes a heater. The energy source 512 may break up the gas from the gas source 510, such as ammonia, so that the nitrogen from the nitrogen containing gas is more reactive.

To react with the gas from the first source 510, precursor material may be delivered from one or more second sources 518. The precursor may be delivered to the chamber 502 by flowing a reactive gas over and/or through the precursor in the precursor source 518. In one embodiment, the reactive gas includes a chlorine containing gas such as diatomic chlorine. The chlorine containing gas may react with the precursor source to form a chloride. In order to increase the effectiveness of the chlorine containing gas to react with the precursor, the chlorine containing gas may snake through the boat area in the chamber 532 and be heated with the resistive heater 520. By increasing the residence time that the chlorine containing gas is snaked through the chamber 532, the temperature of the chlorine containing gas may be controlled. By increasing the temperature of the chlorine containing gas, the chlorine may react with the precursor faster. In other words, the temperature is a catalyst to the reaction between the chlorine and the precursor.

In order to increase the reactivity of the precursor, the precursor may be heated by a resistive heater 520 within the second chamber 532 in a boat. The chloride reaction product may then be delivered to the chamber 502. The reactive chloride product first enters a tube 522 where it evenly distributes within the tube 522. The tube 522 is connected to another tube 524. The chloride reaction product enters the second tube 524 after it has been evenly distributed within the first tube 522. The chloride reaction product then enters into the chamber 502 where it mixes with the nitrogen containing gas to form a nitride layer on a substrate 516 that is disposed on a susceptor 514. In one embodiment, the susceptor 514 includes silicon carbide. The nitride layer may include n-type aluminum gallium nitride for example. The other reaction products, such as nitrogen and chlorine, are exhausted through an exhaust 526.

Some embodiments of the present invention relate to forming UV light emitting devices using aluminum gallium nitride (AlGaN) layers in a dedicated chamber of a fabrication tool, such as in a dedicated MOCVD, or MOVPE, or MBE, or CBE chamber. In at least some embodiments, group III-nitride material layers are formed epitaxially. They may be formed directly on a substrate or on a buffers layer disposed on a substrate. Other contemplated embodiments include p-type doped aluminum gallium nitride layers deposited directly on PVD-formed buffer layers, e.g., PVD-formed aluminum nitride.

It is to be understood that embodiments of the present invention are not limited to formation of layers on the select substrates described above. Other embodiments may include the use of any suitable non-patterned or patterned single crystalline substrate upon which a high quality aluminum nitride layer may be sputter-deposited, e.g., in a non-reactive PVD approach. The substrate may be one such as, but not limited to, a sapphire ($Al_2O_3$) substrate, a silicon (Si) substrate, a silicon carbide (SiC) substrate, a silicon on diamond (SOD) substrate, a quartz ($SiO_2$) substrate, a glass substrate, a zinc oxide (ZnO) substrate, a magnesium oxide (MgO) substrate, and a lithium aluminum oxide ($LiAlO_2$) substrate. Any well know method, such as masking and etching may be utilized to form features, such as posts, from a planar substrate to create a patterned substrate. In a specific embodiment, however, a patterned sapphire substrate (PSS) is used with a (0001) orientation. Patterned sapphire substrates may be ideal for use in the manufacturing of LEDs because they increase the light extraction efficiency which is extremely useful in the fabrication of a new generation of solid state lighting devices. Substrate selection criteria may include lattice matching to mitigate defect formation and coefficient of thermal expansion (CTE) matching to mitigate thermal stresses.

As described above, the group III-nitride films can be doped. The group III-nitride films can be p-typed doped using any p-type dopant such as but not limited Mg, Be, Ca, Sr, or any Group I or Group II element have two valence electrons. The group III-nitride films can be p-type doped to a conductivity level of between $1\times10^{16}$ to $1\times10^{20}$ atoms/$cm^3$. The group III-nitride films can be n-typed doped using any n-type dopant such as but not limited silicon or oxygen, or any suitable Group IV or Group VI element. The group III-nitride films can be n-type doped to a conductivity level of between $1\times10^{16}$ to $1\times10^{20}$ atoms/$cm^3$.

It is to be understood that the above processes may be performed in a dedicated chamber within a cluster tool, or other tool with more than one chamber, e.g. an in-line tool arranged to have a dedicated chamber for fabricating layers of a UV light emitting device. It is also to be understood that embodiments of the present invention need not be limited to the fabrication of UV light emitting devices. For example, in another embodiment, devices other than UV light emitting devices may be fabricated by approaches described herein, such as but not limited to field-effect transistor (FET) devices. In such embodiments, there may not be a need for a p-type material on top of a structure of layers. Instead, an n-type or un-doped material may be used in place of the p-type layer. It is also to be understood that multiple operations, such as various combinations of depositing and/or thermal annealing, may be performed in a single process chamber.

Thus, fabrication of aluminum gallium nitride-based UV light emitting devices with a multi-layer aluminum nitride buffer layers has been disclosed. In accordance with an embodiment of the present invention, a multi-chamber system includes a PVD chamber having a target composed of a material including aluminum to quickly deposit a base aluminum nitride material. A chamber adapted to deposit a high quality aluminum nitride material. A chamber adapted to deposit un-doped or n-type aluminum gallium nitride, or both, is also included in the multi-chamber system. In one embodiment, the target of the PVD chamber is composed of aluminum nitride. In one embodiment, the chamber adapted to deposit the higher quality aluminum nitride material or the un-doped or n-type aluminum gallium nitride is a MOCVD chamber. In one embodiment, the PVD chamber and the chamber adapted to deposit un-doped or n-type aluminum gallium nitride are included in a cluster or an in-line tool arrangement.

Representative concepts enabled herein include:

Concept 1. A method of fabricating an ultraviolet (UV) light emitting device comprising:

receiving a UV transmissive substrate;

forming a UV transmissive layer comprising aluminum nitride upon the UV transmissive substrate, the UV transmissive layer comprising:

forming a first UV transmissive layer comprising aluminum nitride upon the UV transmissive substrate using a first deposition technique at a temperature less than about 800 degrees Celsius or greater than about 1200 degrees Celsius; and forming a second UV transmissive layer comprising aluminum nitride upon the first UV transmissive layer comprising aluminum nitride using a second deposition technique that is different from the first technique, at a temperature within a range of about 800 degrees Celsius to about 1200 degrees Celsius; and forming a UV light emitting layer structure on the UV transmissive layer, the UV light emitting layer structure comprising:
  forming an n-type layer comprising aluminum gallium nitride layer upon the UV transmissive layer;
  forming one or more quantum well structures comprising aluminum gallium nitride upon the n-type layer; and
  forming a p-type nitride layer upon the one or more quantum well structures.

Concept 2. The method of concept 1 wherein the UV transmissive layer comprising aluminum nitride has a thickness within a range of about 100 nm to about 3 microns.

Concept 3. The method of concept 1 wherein the UV transmissive layer comprising aluminum nitride has a thickness of about 2 microns.

Concept 4. The method of concept 1 wherein the UV transmissive layer comprising aluminum nitride has a transmissivity in the UV wavelength range within a range of about 50% to about 99%.

Concept 5. The method of concept 1 wherein the method of forming the first UV transmissive layer uses a deposition process selected from a group consisting of: hydride vapor phase epitaxy, atomic layer deposition, liquid phase epitaxy, physical vapor deposition, sputtering, solid source solution epitaxy.

Concept 6. The method of concept 1 wherein the method of forming the second UV transmissive layer uses a deposition process selected from a group consisting of: metalorganic chemical vapor deposition, metalorganic vapor phase epitaxy, molecular beam epitaxy, chemical beam epitaxy.

Concept 7. The method of concept 1
  wherein the first UV transmissive layer comprises polycrystalline aluminum nitride; and
  wherein the second UV transmissive layer comprises single crystal aluminum nitride.

Concept 8. The method of concept 1 wherein the substrate is selected from a group consisting of: quartz, sapphire and aluminum nitride.

Concept 9. The method of concept 1
  wherein the n-type layer comprises $Al_xGa_{(1-x)}N$;
  wherein the p-type layer comprises $Al_yGa_{(1-y)}N$; and
  wherein x is dissimilar to y.

10. The method of concept 9 wherein
  wherein the one or more quantum well structures comprises $Al_zGa_{(1-z)}N$;
  wherein z is dissimilar to x.

11. An ultraviolet (UV) light emitting device comprising:
  a UV transmissive substrate;
  a UV transmissive layer comprising aluminum nitride layer disposed upon the UV transmissive substrate, the UV transmissive layer comprising:
    a first UV transmissive layer comprising aluminum nitride disposed upon the UV transmissive substrate at a temperature less than about 800 degrees Celsius or greater than about 1200 degrees Celsius; and
    a second UV transmissive layer aluminum nitride disposed upon the first UV transmissive aluminum nitride material at a temperature within a range of about 800 degrees Celsius to about 1200 degrees Celsius; and
  a UV light emitting structure disposed upon the UV transmissive layer, the UV light emitting layer structure comprising:
    an n-type layer comprising aluminum gallium nitride disposed upon the UV transmissive layer;
    one or more quantum well structures disposed upon the n-type layer; and
    a p-type layer comprising nitride material disposed upon the one or more quantum well structures.

Concept 12. The UV device of concept 11 wherein the UV transmissive layer comprising aluminum nitride has a thickness within a range within about 100 nm to about 3 microns.

Concept 13. The UV device of concept 11 wherein the UV transmissive layer comprising aluminum nitride has a thickness of about 2 microns.

Concept 14. The UV device of concept 11 wherein the UV transmissive layer comprising aluminum nitride has a transmissivity in the UV wavelength range within a range of about 50% to about 99%.

Concept 15. The UV device of concept 11
  wherein the first UV transmissive layer comprises polycrystalline aluminum nitride; and
  wherein the second UV transmissive layer comprises single crystal aluminum nitride.

Concept 16. The UV device of concept 1 wherein the UV transmissive substrate comprises a plurality of patterns that scatter strongly with short wavelength UV light.

Concept 17. The UV device of concept 16 wherein the UV-scattering patterns comprises patterns within a height range of about 100 nm to about 500 nm.

Concept 18. The UV device of concept 11 wherein the UV transmissive substrate is selected from a group consisting of: quartz, sapphire and aluminum nitride.

Concept 19. The UV device of concept 11
  wherein the n-type layer comprises $Al_xGa_{(1-x)}N$;
  wherein the p-type layer comprises $Al_yGa_{(1-y)}N$; and
  wherein x is dissimilar to y.

Concept 20. The UV device of concept 19 wherein
  wherein the one or more quantum well structures comprises $Al_zGa_{(1-z)}N$;
  wherein z is dissimilar to x.

Concept 21. A multi-chambered deposition system comprising:
  a first chamber for depositing a first UV transmissive layer comprising aluminum nitride at temperature less than about 800 degrees Celsius or greater than about 1200 degrees Celsius
  a second chamber for depositing a second UV transmissive layer comprising aluminum nitride at a temperature within a range of about 800 degrees Celsius to about 1200 degrees Celsius; upon the first UV transmissive layer comprising aluminum nitride;
  and depositing an n-type layer comprising aluminum gallium nitride material upon the second UV transmissive layer; and
  depositing one or more quantum well structures comprising aluminum gallium nitride upon the n-type layer; and
  depositing a p-type nitride layer upon the one or more quantum well structures.

Concept 22. The system of concept 21 wherein the first chamber comprises a chamber adapted to perform a hydride vapor phase epitaxy, atomic layer deposition, liquid phase epitaxy, physical vapor deposition, sputtering, or solid source solution growth.

Concept 23. The system of concept 21 wherein the second chamber comprises a chamber adapted to perform metalorganic chemical vapor deposition, metalorganic vapor phase epitaxy, molecular beam epitaxy, or chemical beam epitaxy.

Concept 24. The system of concept 21 wherein the wafer transfer between the first chamber and the second chamber is automated.

Concept 25. The system of concept 21 wherein the wafer transfer between the first chamber and the second chamber is performed under vacuum.

Concept 26. A multi-chambered deposition system comprising:
a first chamber for depositing a first UV transmissive layer comprising aluminum nitride at temperature less than about 800 degrees Celsius or greater than about 1200 degrees Celsius
a second chamber for depositing a second UV transmissive layer comprising aluminum nitride at a temperature within a range of about 800 degrees Celsius to about 1200 degrees Celsius; upon the first UV transmissive layer comprising aluminum nitride
a third chamber for depositing an n-type layer comprising aluminum gallium nitride material upon the second UV transmissive layer; and
depositing one or more quantum well structures comprising aluminum gallium nitride upon the n-type layer; and
depositing a p-type nitride layer upon the one or more quantum well structures.

Concept 27. The system of concept 26 wherein the first chamber comprises a chamber adapted to perform a hydride vapor phase epitaxy, atomic layer deposition, liquid phase epitaxy, physical vapor deposition, sputtering, solid source solution growth.

Concept 28. The system of concept 26 wherein the second and third chamber comprise a chamber adapted to perform metalorganic chemical vapor deposition, metalorganic vapor phase epitaxy, molecular beam epitaxy, or chemical beam epitaxy.

Concept 29. The system of concept 26 wherein the wafer transfer among the first, second and third chamber is automated.

Concept 30. The system of concept 26 wherein the wafer transfer among the first, second and third chamber is performed under vacuum.

Concept 31. A multi-chambered deposition system comprising:
a first chamber for depositing a first UV transmissive layer comprising aluminum nitride at temperature less than about 800 degrees Celsius or greater than about 1200 degrees Celsius
a second chamber for depositing a second UV transmissive layer comprising aluminum nitride at a temperature within a range of about 800 degrees Celsius to about 1200 degrees Celsius; upon the first UV transmissive layer comprising aluminum nitride
a third chamber for depositing an n-type layer comprising aluminum gallium nitride material upon the second UV transmissive layer; and
depositing one or more quantum well structures comprising aluminum gallium nitride upon the n-type layer; and
a fourth chamber for depositing a p-type nitride layer upon the one or more quantum well structures.

Concept 32. The system of concept 31 wherein the first chamber comprises a chamber adapted to perform a hydride vapor phase epitaxy, atomic layer deposition, liquid phase epitaxy, physical vapor deposition, sputtering, solid source solution growth.

Concept 33. The system of concept 31 wherein the second, third and fourth chamber comprise a chamber adapted to perform metalorganic chemical vapor deposition, metalorganic vapor phase epitaxy, molecular beam epitaxy, or chemical beam epitaxy.

Concept 34. The system of concept 31 wherein the wafer transfer among the first, second, third, and fourth chamber is automated.

Concept 35. The system of concept 31 wherein the wafer transfer among the first, second, third, and fourth chamber is performed under vacuum.

Concept 36. A multi-chambered deposition system comprising:
a first chamber for depositing a first UV transmissive layer comprising aluminum nitride at temperature less than about 800 degrees Celsius or greater than about 1200 degrees Celsius
a second chamber for depositing a second UV transmissive layer comprising aluminum nitride at a temperature within a range of about 800 degrees Celsius to about 1200 degrees Celsius; upon the first UV transmissive layer comprising aluminum nitride
a third chamber for depositing an n-type layer comprising aluminum gallium nitride material upon the second UV transmissive layer; and
a fourth chamber for depositing one or more quantum well structures comprising aluminum gallium nitride upon the n-type layer; and
a fifth chamber for depositing a p-type nitride layer upon the one or more quantum well structures.

Concept 37. The system of concept 36 wherein the first chamber comprises a chamber adapted to perform a hydride vapor phase epitaxy, atomic layer deposition, liquid phase epitaxy, physical vapor deposition, sputtering, solid source solution growth.

Concept 38. The system of concept 36 wherein the second, third, fourth and fifth chamber comprise a chamber adapted to perform metalorganic chemical vapor deposition, Metalorganic vapor phase epitaxy, molecular beam epitaxy, or chemical beam epitaxy.

Concept 39. The system of concept 36 wherein the wafer transfer among the first, second, third, fourth and fifth chamber is automated.

Concept 40. The system of concept 36 wherein the wafer transfer among the first, second, third, fourth and fifth chamber is performed under vacuum.

What is claimed is:
1. A method of fabricating an ultraviolet (UV) light emitting device comprising:
receiving a UV transmissive substrate;
forming a UV transmissive layer upon the UV transmissive substrate, comprising:
forming a first UV transmissive layer comprising aluminum nitride upon the UV transmissive substrate using a first deposition technique at a temperature less than about 800 degrees Celsius or greater than about 1200 degrees Celsius; and
forming a second UV transmissive layer comprising aluminum nitride upon the first UV transmissive layer comprising aluminum nitride using a second deposition technique that is different from the first deposition technique, at a temperature within a range of about 800 degrees Celsius to about 1200 degrees Celsius; and
forming a UV light emitting layer structure on the UV transmissive layer, comprising:
forming an n-type layer comprising aluminum gallium nitride layer upon the UV transmissive layer;

forming one or more quantum well structures comprising aluminum gallium nitride upon the n-type layer; and forming a p-type nitride layer upon the one or more quantum well structures.

2. The method of claim 1 wherein the UV transmissive layer has a thickness within a range of about 10 nm to about 3 microns.

3. The method of claim 1 wherein the UV transmissive layer has a thickness of about 3 microns to 10 microns.

4. The method of claim 1 wherein the UV transmissive layer has transmissivity in the UV wavelength range within a transmissivity range of about 50% to about 99%.

5. The method of claim 1 wherein the method of forming the first UV transmissive layer uses a deposition process selected from a group consisting of: hydride vapor phase epitaxy, atomic layer deposition, liquid phase epitaxy, physical vapor deposition, sputtering, solid source solution epitaxy.

6. The method of claim 1 wherein the method of forming the second UV transmissive layer uses a deposition process selected from a group consisting of:

metalorganic chemical vapor deposition, metalorganic vapor phase epitaxy, molecular beam epitaxy, chemical beam epitaxy.

7. The method of claim 1 wherein the first UV transmissive layer comprises polycrystalline aluminum nitride; and wherein the second UV transmissive layer comprises single crystal aluminum nitride.

8. The method of claim 1 wherein the receiving the UV transmissive substrate comprises receiving a substrate selected from a group consisting of: a quartz substrate, a sapphire substrate, and a free standing single crystal aluminum nitride substrate.

\* \* \* \* \*